United States Patent
Leobandung et al.

(10) Patent No.: US 9,929,255 B2
(45) Date of Patent: Mar. 27, 2018

(54) ROBUST GATE SPACER FOR SEMICONDUCTOR DEVICES

(71) Applicant: International Business Machines Corporation, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/430,079

(22) Filed: Feb. 10, 2017

(65) Prior Publication Data

US 2017/0154980 A1 Jun. 1, 2017

Related U.S. Application Data

(62) Division of application No. 14/244,945, filed on Apr. 4, 2014, now Pat. No. 9,570,554.

(51) Int. Cl.
*H01L 29/66* (2006.01)
*H01L 29/417* (2006.01)

(52) U.S. Cl.
CPC .. *H01L 29/66795* (2013.01); *H01L 29/41783* (2013.01); *H01L 29/6656* (2013.01)

(58) Field of Classification Search
None
See application file for complete search history.

(56) References Cited

U.S. PATENT DOCUMENTS

| | | |
|---|---|---|
| 7,642,152 B2 | 1/2010 | Wang et al. |
| 8,143,131 B2 | 3/2012 | Hsu et al. |
| 8,390,040 B2 | 3/2013 | Ban et al. |

(Continued)

FOREIGN PATENT DOCUMENTS

| | | |
|---|---|---|
| KR | 20020003761 A | 1/2002 |
| KR | 1020040080790 A | 9/2004 |

(Continued)

OTHER PUBLICATIONS

List of IBM Patents or Patent Applications Treated As Related dated Feb. 10, 2017, 2 pages.

*Primary Examiner* — Erik Kielin
(74) *Attorney, Agent, or Firm* — Scully, Scott, Murphy & Presser, P.C.; Louis J. Percello, Esq.

(57) ABSTRACT

After formation of a gate structure and a lower dielectric spacer laterally surrounding the gate structure, a disposable material layer is deposited and planarized such that the top surface of the disposable material layer is formed below the topmost surface of the lower dielectric spacer. An upper dielectric spacer is formed around the gate structure and over the top surface of the disposable material layer. The disposable material layer is removed selective to the upper and lower dielectric spacers and device components underlying the gate structure. Semiconductor surfaces of the gate structure can be laterally sealed by the stack of the lower and upper dielectric spacers. Formation of any undesirable semiconductor deposition on the gate structure can be avoided by the combination of the lower and upper dielectric spacers during a subsequent selective epitaxy process.

20 Claims, 11 Drawing Sheets

(56) References Cited

U.S. PATENT DOCUMENTS

| | | | |
|---|---|---|---|
| 2005/0054134 A1* | 3/2005 | Frey | B81C 1/00595 |
| | | | 438/50 |
| 2006/0281270 A1 | 12/2006 | Meer et al. | |
| 2008/0001187 A1 | 1/2008 | Booth et al. | |
| 2008/0048268 A1 | 2/2008 | Hsu et al. | |
| 2008/0237726 A1 | 10/2008 | Dyer | |
| 2009/0017584 A1 | 1/2009 | Cheng et al. | |
| 2010/0148217 A1 | 6/2010 | Simonelli et al. | |
| 2010/0295022 A1* | 11/2010 | Chang | B82Y 10/00 |
| | | | 257/24 |
| 2011/0193172 A1 | 8/2011 | Juengling | |
| 2011/0198673 A1 | 8/2011 | Bonser et al. | |
| 2011/0227136 A1 | 9/2011 | Park et al. | |
| 2011/0227161 A1 | 9/2011 | Zhu et al. | |
| 2011/0309333 A1 | 12/2011 | Cheng et al. | |
| 2012/0138436 A1* | 6/2012 | Gambino | H01H 59/0009 |
| | | | 200/181 |
| 2012/0276695 A1* | 11/2012 | Cheng | H01L 27/1211 |
| | | | 438/154 |
| 2012/0306049 A1* | 12/2012 | Booth, Jr. | H01L 28/92 |
| | | | 257/532 |
| 2013/0049115 A1* | 2/2013 | Cheng | H01L 29/66803 |
| | | | 257/347 |
| 2014/0027860 A1 | 1/2014 | Glass et al. | |
| 2015/0091094 A1 | 4/2015 | Wan et al. | |
| 2015/0126012 A1 | 5/2015 | Jeong et al. | |

FOREIGN PATENT DOCUMENTS

| KR | 1020080089998 A | 10/2008 |
|---|---|---|
| KR | 1020100002674 A | 1/2010 |

* cited by examiner

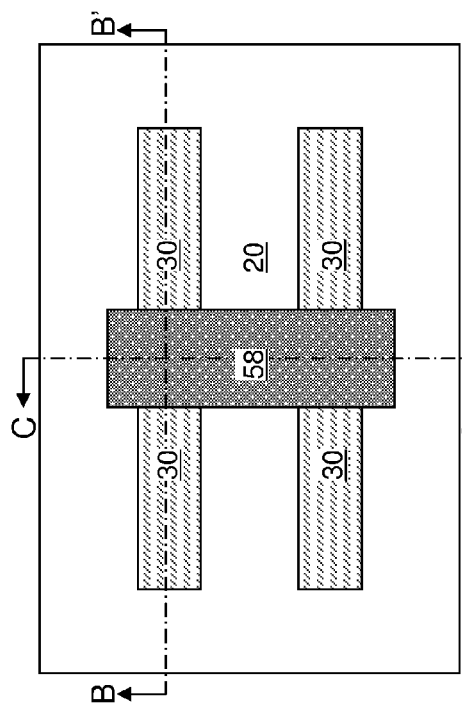
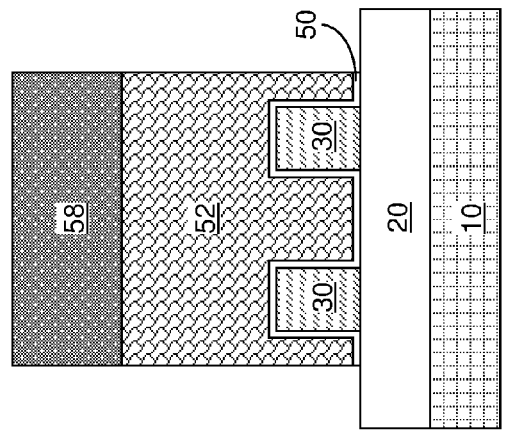
FIG. 2A
FIG. 2B
FIG. 2C

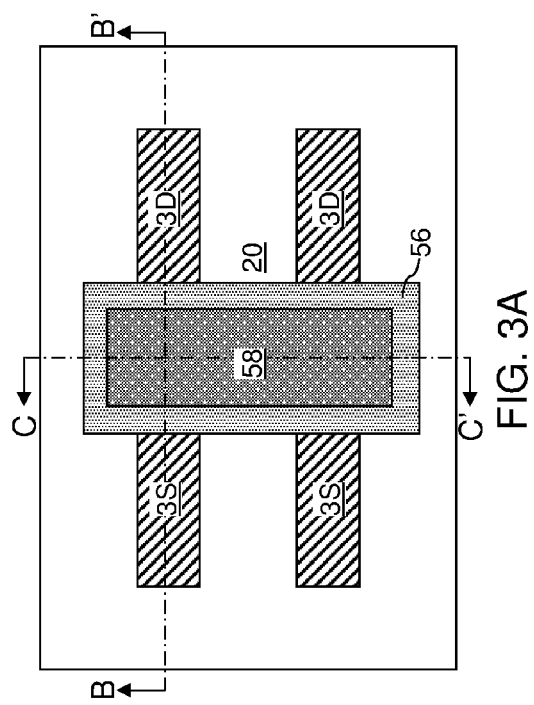
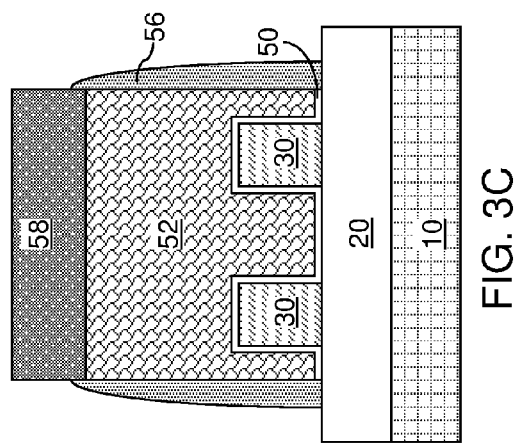
FIG. 3A
FIG. 3B
FIG. 3C

ROBUST GATE SPACER FOR SEMICONDUCTOR DEVICES

BACKGROUND

The present disclosure relates to a semiconductor device, and more specifically, a semiconductor device including a vertical stack of gate spacers and a method manufacturing the same.

Selective epitaxy is employed in many semiconductor processing steps including formation of raised source and drain regions. In a selective epitaxy process, a semiconductor material is deposited on semiconductor surfaces, while not depositing on dielectric surfaces. While a selective epitaxy process of a semiconductor material can form many useful structures, accidental exposure of a semiconductor surface prior to the selective epitaxy process causes unwanted growth of the semiconductor material directly on such accidentally exposed semiconductor surface. For example, physical exposure of a top portion of a gate electrode including a semiconductor material by an overetch of a dielectric material layer during formation of a gate spacer can lead to unwanted deposition of a semiconductor material on the top portion of the gate electrode during formation of raised source and drain regions. Thus, a method is desired for systematically preventing such unwanted exposure of a semiconductor material from surfaces of a protruding structure in a semiconductor device.

SUMMARY

After formation of a gate structure and a lower dielectric spacer laterally surrounding the gate structure, a disposable material layer is deposited and planarized such that the top surface of the disposable material layer is formed below the topmost surface of the lower dielectric spacer. An upper dielectric spacer is formed around the gate structure and over the top surface of the disposable material layer. The disposable material layer is removed selective to the upper and lower dielectric spacers and device components underlying the gate structure. Semiconductor surfaces of the gate structure can be laterally sealed by the stack of the lower and upper dielectric spacers. Formation of any undesirable semiconductor deposition on the gate structure can be avoided by the combination of the lower and upper dielectric spacers during a subsequent selective epitaxy process.

According to an aspect of the present disclosure, a semiconductor structure is provided, which includes a semiconductor material portion located on a substrate, a gate structure, a lower gate spacer, and an upper gate spacer. The gate structure includes a gate dielectric and a gate electrode and straddles the semiconductor material portion. The lower dielectric spacer laterally contacts, and surrounds, a lower portion of the gate structure. The upper dielectric spacer laterally contacts, and surrounds an upper portion of the gate structure.

According to another aspect of the present disclosure, a method of forming a semiconductor structure is provided. A gate structure including a gate dielectric and a gate electrode is formed across a semiconductor material portion on a substrate. A lower dielectric spacer is formed around a lower portion of the gate structure. A disposable material layer is formed around the lower dielectric spacer. An upper dielectric spacer is formed around an upper portion of the gate structure and on a top surface of the disposable material layer. The disposable material layer is removed selective to the upper and lower dielectric spacers and the semiconductor material portion.

BRIEF DESCRIPTION OF THE SEVERAL VIEWS OF THE DRAWINGS

FIG. 2A is a top-down view of the first exemplary semiconductor structure after formation of a gate structure according to an embodiment of the present disclosure.

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

FIG. 3A is a top-down view of the first exemplary semiconductor structure after formation of source and drain regions and a lower dielectric spacer according to an embodiment of the present disclosure.

FIG. 3B is a vertical cross-sectional view of the first exemplary semiconductor structure along the vertical plane B-B' of FIG. 3A.

FIG. 3C is a vertical cross-sectional view of the first exemplary semiconductor structure along the vertical plane C-C' of FIG. 3A.

DETAILED DESCRIPTION

Figure 1A:
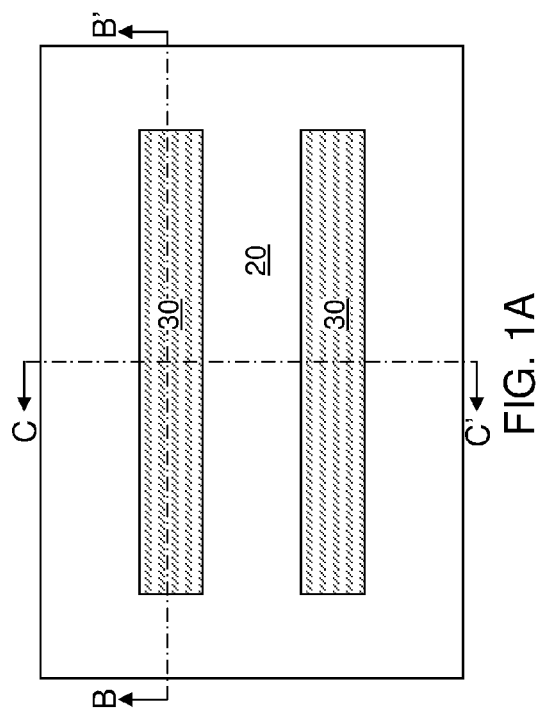
FIG. 1A is a top-down view of a first exemplary semiconductor structure after formation of semiconductor fins according to an embodiment of the present disclosure.

As stated above, the present disclosure relates to a semiconductor device including a vertical stack of gate spacers and a method manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

Figure 1B:
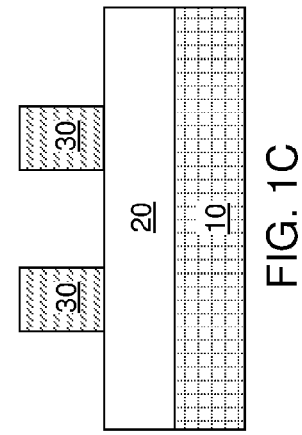
FIG. 1B is a vertical cross-sectional view of the first exemplary semiconductor structure along the vertical plane B-B' of FIG. 1A.
Figure 1C:
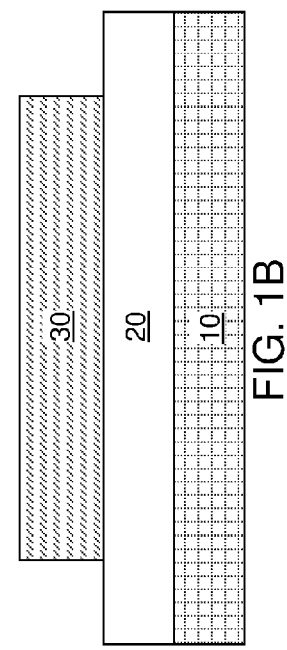
FIG. 1C is a vertical cross-sectional view of the first exemplary semiconductor structure along the vertical plane C-C' of FIG. 1A.

Referring to FIGS. 1A-1C, an exemplary semiconductor structure according to an embodiment of the present disclosure includes semiconductor material portions located on a substrate (10, 20). In one embodiment, the semiconductor material portions can be semiconductor fins 30. As used herein, a "semiconductor fin" refers to a semiconductor material portion having a parallel pair of vertical sidewalls. In one embodiment, the height of a semiconductor fin, i.e., the height of the pair of vertical sidewalls, can be greater than width of the semiconductor fin. Each semiconductor fin 30 can extend along a direction parallel to the parallel pair of vertical sidewalls, which is herein referred to as a "lengthwise direction" of the semiconductor fin.

While the present disclosure is described employing semiconductor fins 30 as semiconductor material portions, it is understood that the present disclosure can be applied to other types of semiconductor material portions such as an active semiconductor region for forming a source region, a drain region, and a body region of a planar field effect transistor, or a base region or an emitter region of a bipolar transistor. In general, the present disclosure can be practiced in any semiconductor device in which a spacer can be formed around a semiconductor material portion, and the present disclosure should be interpreted to encompass all such variations.

A top portion of the substrate (10, 20) includes an insulator material. In one embodiment, the substrate (10, 20) can include, from bottom to top, a handle substrate 10 and an insulator layer 20. In one embodiment, the exemplary semiconductor structure can be formed by providing a semiconductor-on-insulator (SOI) substrate including the handle substrate 10, the insulator layer 20, and a top semiconductor layer, and patterning the top semiconductor layer into semiconductor fins 30 by a combination of lithographic patterning and an anisotropic etch as known in the art.

The semiconductor fins 30 includes a semiconductor material, which can be an elemental semiconductor material such as silicon or germanium; a semiconductor alloy of Group IV elements such as a silicon-germanium alloy, a silicon-carbon alloy, or a silicon-germanium-carbon alloy; a compound semiconductor material; or an organic semiconductor material. In one embodiment, the entirety of each semiconductor fin 30 can be single crystalline. In one embodiment, the semiconductor fins 30 can be single crystalline silicon fins. The height of the semiconductor fins 30 can be in a range from 30 nm to 300 nm, although lesser and greater thicknesses can also be employed.

Referring to FIGS. 2A-2C, a gate structure (50, 52, 58) can be formed across the semiconductor fins 30. The gate structure (50, 52, 58) includes a stack of a gate dielectric 50 a gate electrode 52, and a gate cap dielectric 58. The gate structure (50, 52, 58) can be formed by deposition of a gate dielectric layer, a gate conductor layer, and a gate cap dielectric layer, and by patterning of the gate cap dielectric layer, the gate conductor layer, and the gate dielectric layer by a combination of lithographic methods and at lease one etch. For example, a photoresist layer (not shown) can be applied over the gate cap dielectric layer and can be lithographically patterned to cover regions straddling the semiconductor fins 30, and the portions of the gate cap dielectric layer and the gate conductor layer that are not covered by the patterned photoresist layer can be removed by at least one anisotropic etch. Subsequently, physically exposed portions of the gate dielectric layer can be removed by an isotropic etch or an anisotropic etch. The photoresist layer is subsequently removed, for example, by ashing. A remaining portion of the gate cap dielectric layer constitutes a gate cap dielectric 58, a remaining portion of the gate conductor layer constitutes a gate electrode 52, and a remaining portion of the gate dielectric layer constitutes a gate dielectric 50. Each gate structure (50, 52, 58) can straddle at least one semiconductor fin 30. The gate structure (50, 52, 58) can straddle a single semiconductor fin 30, or can straddle a plurality of semiconductor fins 30.

The gate cap structure 58 includes a dielectric material, which can be, for example, silicon nitride, silicon oxynitride, a dielectric metal oxide, or a combination thereof. The thickness of the gate cap structure 58 can be in a range from 30 nm to 600 nm, although lesser and greater thicknesses can also be employed. In one embodiment, the thickness of the gate cap structure 58 can be greater than the height of the semiconductor fins 30.

The gate electrode 52 can include a doped semiconductor material, a metallic material, or a combination thereof. The thickness of the gate electrode 52, as measured from above the topmost surface of the gate dielectric 50, can be in a range from 30 nm to 300 nm, although lesser and greater thicknesses can also be employed.

The gate dielectric 50 can include a semiconductor oxide such as silicon oxide, a semiconductor oxynitride such as silicon oxynitride, and/or a dielectric metal oxide. The thickness of the gate dielectric 50 can be in a range from 1 nm to 10 nm, although lesser and greater thicknesses can also be employed.

Referring to FIGS. 3A-3C, a lower gate spacer 56 can be formed around a lower portion of the gate structure (50, 52, 58). The lower gate spacer 56 can be formed, for example, by deposition of a conformal dielectric material layer and by an anisotropic etch that removes horizontal portions of the conformal dielectric material layer. An overetch can be employed during the anisotropic etch to remove vertical portions of the conformal dielectric material layer from the sidewalls of the semiconductor fins 30 (See FIGS. 2A-2C) that are farther away from the outer sidewalls of the gate structures (50, 52, 58) than the thickness of the conformal dielectric material layer. The remaining vertical portions of the conformal dielectric material layer constitute the lower gate spacer 56. The conformal dielectric material layer includes a dielectric material such as silicon nitride, silicon oxide, silicon oxynitride, a dielectric metal oxide, or a combination thereof. The thickness of the lower gate spacers 56 is the same as the thickness of the conformal dielectric material layer, and can be in a range from 5 nm to 100 nm, although lesser and greater thicknesses can also be employed.

The outer sidewalls of the lower gate spacer 56 can include non-vertical portions at upper portions thereof. Specifically, the portions of the outer sidewalls of the lower gate spacer 56 in contact with the gate structure (50, 52, 58) can be at a non-zero angle α with respect to a vertical surface of the gate structure (50, 52, 58) to which the outer sidewalls are adjoined to. In one embodiment, a topmost edge of the outer sidewalls of the lower gate spacer 56 can contact the gate structure (50, 52, 58) at a sidewall surface of the gate cap dielectric 58. In another embodiment, a topmost edge of the outer sidewalls of the lower gate spacer 56 can contact the gate structure (50, 52, 58) at a sidewall surface of the gate electrode 52.

Source regions 3S and drain regions 3D can be performed after formation of the gate spacers 56 and/or prior to formation of the gate spacers 56. Electrical dopants are introduced into portions of the semiconductor fins 30 that are not covered by the gate structure (50, 52, 58) or by a combination of the gate structure (50, 52, 58) and the gate spacers 56. The source regions 3S and the drain regions 3D are formed in regions into which the electrical dopants are introduced. Portions into which the electrical dopants are not introduced constitute the body regions 3B.

The electrical dopants can be p-type dopants or n-type dopants. Alternatively, p-type dopants can be introduced into a semiconductor fin 30 to form p-doped source regions and p-doped drain regions, and n-type dopants can be introduced into another semiconductor fin 30 to form n-doped source regions and n-doped drain regions. The introduction of the electrical dopants can be performed by ion implantation, plasma doping, outdiffusion of electrical dopants from at least one sacrificial doped silicate glass layers, and/or by deposition of a doped semiconductor material by a selective deposition (such as selective epitaxy) and outdiffusion of the electrical dopants from the deposited doped semiconductor material as known in the art.

Figure 4A:
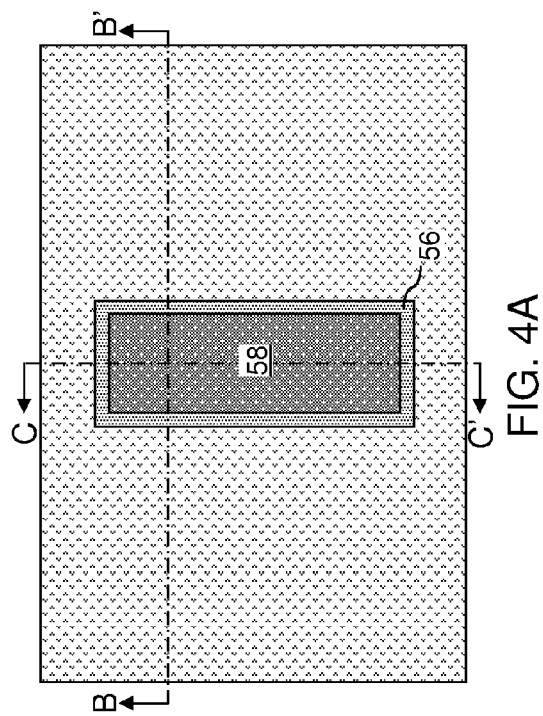
FIG. 4A is a top-down view of the first exemplary semiconductor structure after applying and planarizing a disposable material layer according to an embodiment of the present disclosure.
Figure 4C:
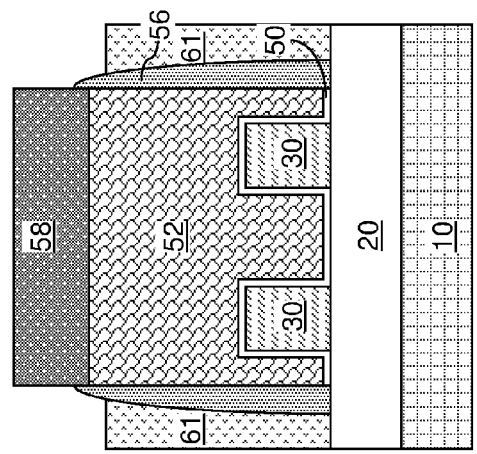
FIG. 4C is a vertical cross-sectional view of the first exemplary semiconductor structure along the vertical plane C-C' of FIG. 4A.
Figure 4B:
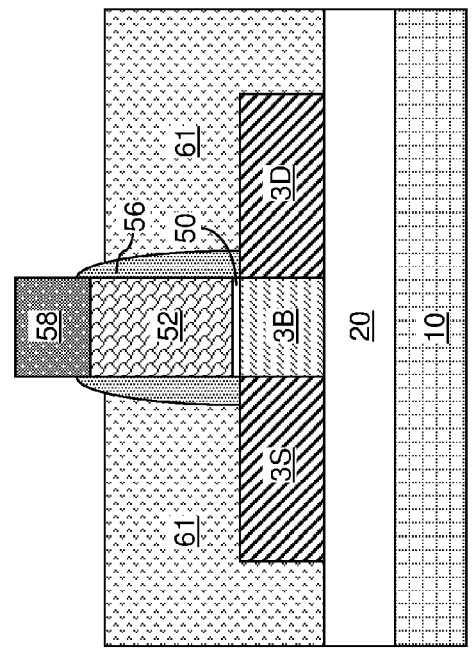
FIG. 4B is a vertical cross-sectional view of the first exemplary semiconductor structure along the vertical plane B-B' of FIG. 4A.

Referring to FIGS. 4A-4C, a disposable material layer 61 is applied and planarized over the semiconductor fins (3S, 3D, 3B) and around the lower dielectric spacer 56. The disposable material layer 61 can include a self-planarizing material such as flowable oxide (FOX) or a spin-on glass, or can include a non-self-planarizing material. In one embodiment, the disposable material layer 61 can be deposited by spin-on coating of a self-planarizing material. In another embodiment, the disposable material layer 61 can be formed by deposition of a disposable material by chemical vapor deposition, planarization of the deposited disposable material, for example, by chemical mechanical planarization (CMP), and by recessing the top surface of the planarized disposable material, for example, by a recess etch, which can be a wet etch or a dry etch.

In one embodiment, the disposable material layer 61 can include an organic polymer material. In one embodiment, the organic polymer material can be an organic planarization material that is employed as a self-planarization material in lithography. In one embodiment, the organic polymer material can be a non-photosensitive organic polymer material as known in the art. As used herein, a "non-photosensitive" material refers to a material that does not change chemical property upon irradiation for lithographic exposure employing a conventional light wavelength and a conventional dose level for exposure as known in the art. Exemplary organic planarizing materials that can be employed for the disposable material layer 61 include ODL-102™, commercially available from ShinEtsu Chemical Co. Ltd.; HM8006™ and HM8014™, commercially available from JSR Corporation; and CHM701B™, commercially available from Cheil Chemical Co. Ltd. The organic polymer material can be deposited, for example, by spin coating.

In another embodiment, the disposable material layer 61 can include a semiconductor material having a different composition than the semiconductor fins (3S, 3D, 3B) on the substrate. For example, the semiconductor fins (3S, 3D, 3B) can be silicon fins or silicon-germanium alloy fins, and the disposable material layer 61 can include germanium or a silicon-germanium alloy having a greater atomic concentration of germanium than the semiconductor material of the semiconductor fins (3S, 3D, 3B). In one embodiment, the semiconductor fins (3S, 3D, 3B) can include silicon at an atomic concentration greater than 80%, and the disposable material layer 61 can include germanium at an atomic concentration greater than 80%. The semiconductor materials for the disposable material layer 61 can be deposited, for example, by chemical vapor deposition (CVD), and can be subsequently recessed, for example, by a recess etch.

In yet another embodiment, the disposable material layer 61 can include an inorganic carbon-containing material such as amorphous carbon or diamond-like carbon. Methods of depositing inorganic carbon-containing materials are known in the art.

In still another embodiment, the disposable material layer 61 can include porous or non-porous organosilicate glass (OSG) including silicon, carbon, oxygen, hydrogen, and optionally nitrogen. The organosilicate glass material for the disposable material layer 61 can be deposited, for example, by chemical vapor deposition (CVD), and can be subsequently recessed, for example, by a recess etch.

In one embodiment, the planar top surface of the disposable material layer 61 can be formed below a horizontal plane including a topmost surface of the lower dielectric spacer 56. In one embodiment, the planar top surface of the disposable material layer 61 can be formed above another horizontal plane including a topmost surface of the semiconductor fins (3S, 3D, 3B).

Figure 5A:
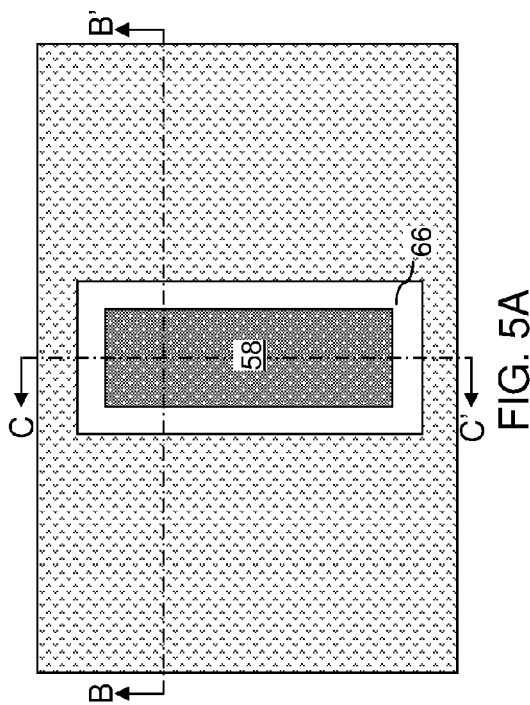
FIG. 5A is a top-down view of the first exemplary semiconductor structure after formation of an upper dielectric spacer according to an embodiment of the present disclosure.
Figure 5C:
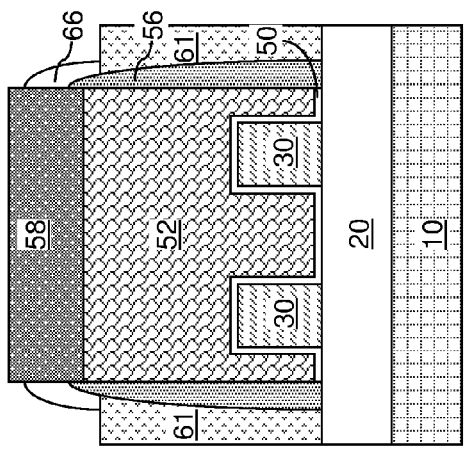
FIG. 5C is a vertical cross-sectional view of the first exemplary semiconductor structure along the vertical plane C-C' of FIG. 5A.
Figure 5B:
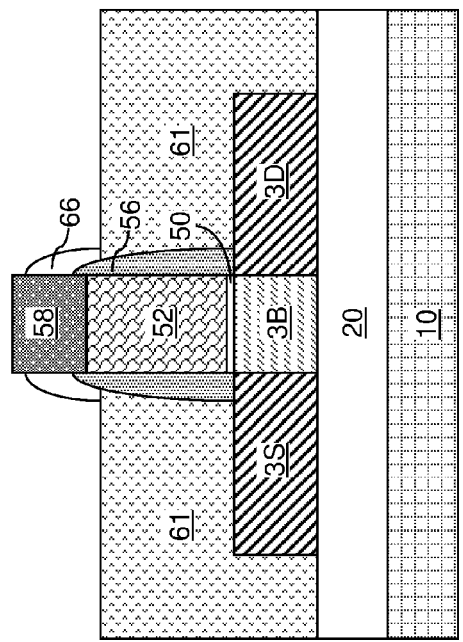
FIG. 5B is a vertical cross-sectional view of the first exemplary semiconductor structure along the vertical plane B-B' of FIG. 5A.

Referring to FIGS. 5A-5C, an upper dielectric spacer 66 is formed around an upper portion of the gate structure (50, 52, 58) and on the top surface of the disposable material layer 61. The upper gate spacer 66 can be formed, for example, by deposition of a conformal dielectric material layer and by an anisotropic etch that removes horizontal portions of the conformal dielectric material layer. The remaining vertical portions of the conformal dielectric material layer constitute the upper gate spacer 66. The conformal dielectric material layer includes a dielectric material such as silicon nitride, silicon oxide, silicon oxynitride, a dielectric metal oxide, or a combination thereof. The composition of the upper dielectric spacer 66 can be different from, or can be the same as, the composition of the lower dielectric spacer 56. The thickness of the upper dielectric spacer 66, as measured at a height having a greatest lateral thickness, can be the same as the thickness of the lower dielectric spacer 56 as measured at the bottommost portion of the lower dielectric spacer 56. The thickness of the upper gate spacers 66 can be in a range from 5 nm to 100 nm, although lesser and greater thicknesses can also be employed. In one embodiment, the upper dielectric spacer 66 can differ from the lower dielectric spacer 56 at least in one of composition and thickness.

The bottom surface of the upper gate spacer 66 can be coincident with the top surface of the disposable material layer 61, and thus, can be "planar," i.e., located within a horizontal two-dimensional Euclidean plane. The inner periphery of the bottom surface of the upper gate spacer 66 is located on the outer sidewalls of the lower gate spacer 56, and laterally surrounds the gate structure (50, 52, 58). The bottom surface of the upper gate spacer 66 can be formed below a horizontal plane including a topmost surface of the lower dielectric spacer 56. In one embodiment, the bottom surface of the upper gate spacer 66 can be formed above another horizontal plane including a topmost surface of the semiconductor fins (3S, 3D, 3B).

Figure 6C:
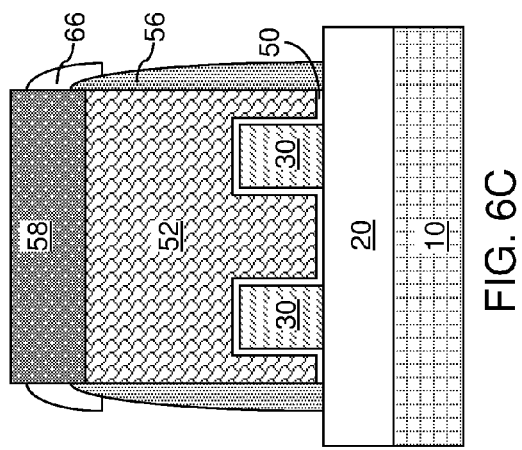
FIG. 6C is a vertical cross-sectional view of the first exemplary semiconductor structure along the vertical plane C-C' of FIG. 6A.
Figure 6A:
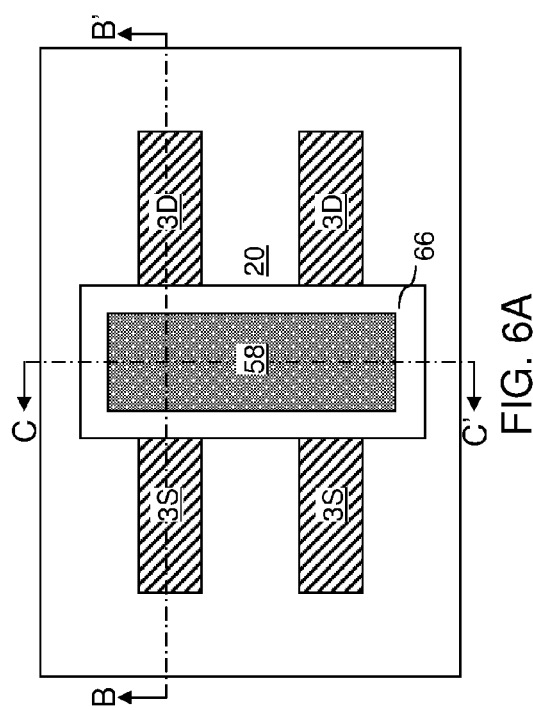
FIG. 6A is a top-down view of the first exemplary semiconductor structure after removal of the disposable material layer according to an embodiment of the present disclosure.
Figure 6B:
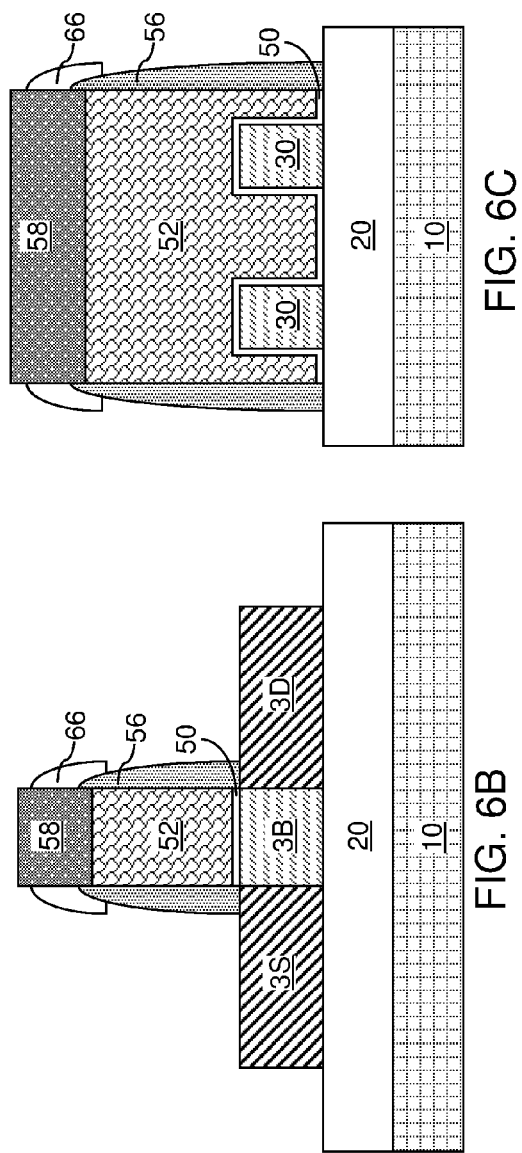
FIG. 6B is a vertical cross-sectional view of the first exemplary semiconductor structure along the vertical plane B-B' of FIG. 6A.

Referring to FIGS. 6A-6C, the disposable material layer 61 is removed selective to the lower and upper gate spacers (56, 66) and the semiconductor fins (3S, 3D, 3B). If the disposable material layer 61 can include an organic polymer material or an inorganic carbon-containing material, the organic polymer material or the inorganic carbon-containing material can be removed by ashing, i.e., combustion in a controlled environment. If the disposable material layer 61 includes a semiconductor material different from the semiconductor material of the semiconductor fins (3S, 3D, 3B), a wet etch process can be employed to remove the semiconductor material of the disposable material layer 61. For example, a combination of hydrogen peroxide and hydrofluoric acid can be employed to remove a germanium-containing material having an atomic concentration of germanium greater than 80% to a silicon-containing material having an atomic concentration of silicon greater than 80%. If the disposable material layer 61 includes porous or non-porous organosilicate glass, a wet etch process employing hydrofluoric acid can be employed to remove the organosilicate glass.

Figure 7A:
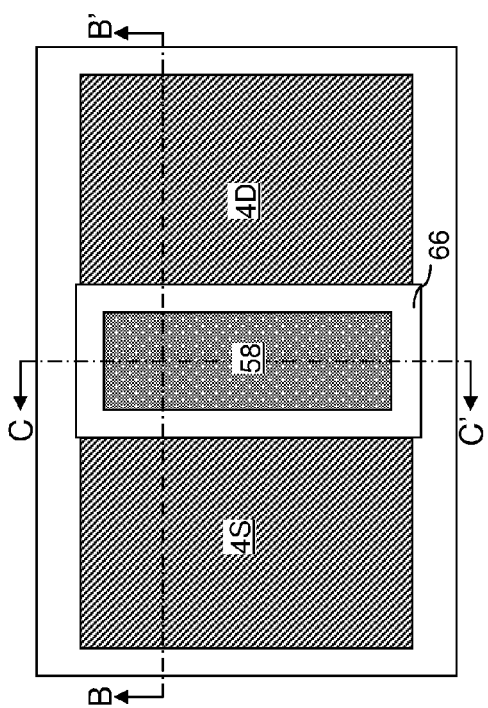
FIG. 7A is a top-down view of the first exemplary semiconductor structure after formation of raised source and drain regions according to an embodiment of the present disclosure.
Figure 7C:
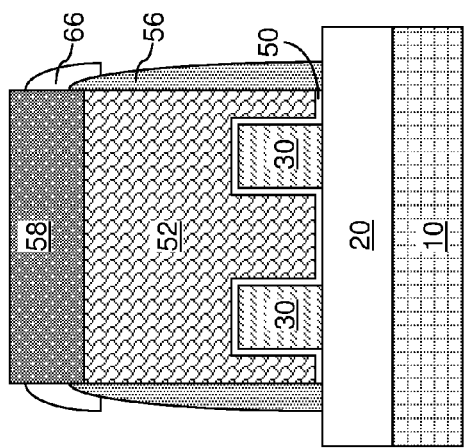
FIG. 7C is a vertical cross-sectional view of the first exemplary semiconductor structure along the vertical plane C-C' of FIG. 7A.
Figure 7B:
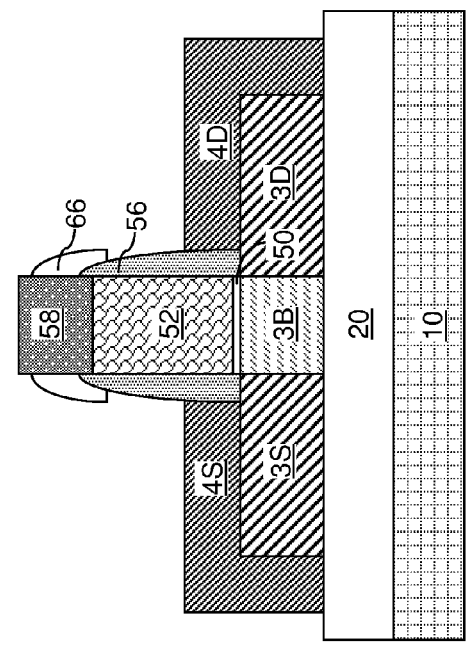
FIG. 7B is a vertical cross-sectional view of the first exemplary semiconductor structure along the vertical plane B-B' of FIG. 7A.

Referring to FIGS. 7A-7C, a raised source region 4S and a raised drain region 4D can optionally be formed on the source regions 3S and the drain regions 4S by selective deposition of a semiconductor material. The semiconductor material of the raised source region 4S and the raised drain region 4D can be deposited with in-situ doping, or can be deposited as an intrinsic semiconductor material and subsequently doped with electrical dopants (which can be p-type dopants or n-type dopants) by ion implantation, plasma doping, or outdiffusion from a sacrificial doped silicate glass layer.

During the selective deposition of the semiconductor material, a semiconductor material is selectively deposited on physically exposed surfaces of the semiconductor material portion while not nucleating on the dielectric surfaces of the upper and lower gate spacers (56, 66). The semiconductor material of the raised source region 4S and the raised drain region 4D can be deposited, for example, by a selective epitaxy process, which deposits the semiconductor material only on semiconductor surfaces and does not deposit the semiconductor material on dielectric surfaces. In one embodiment, the raised source region 4S can be epitaxially aligned to one or more source regions 3S, and the raised drain region 4D can be epitaxially aligned to one or more drain regions 3D.

In one embodiment, the raised source region 4S and the raised drain region 4D contact the lower dielectric spacer 56 and do not contact the upper dielectric spacer 66. Each of the raised source region 4S and the raised drain region 4D may be formed as a single contiguous structure contacting a plurality of source regions 3S or a plurality of drain regions 3D, or can be formed as multiple disjoined structures that do not contact one another.

Figure 8A:
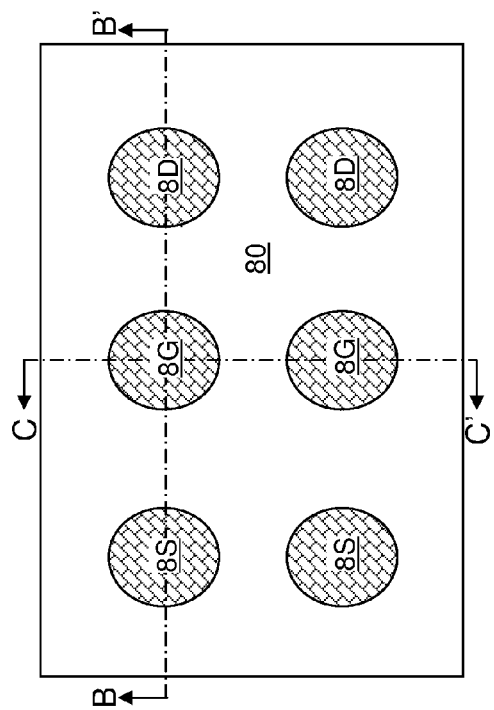
FIG. 8A is a top-down view of the first exemplary semiconductor structure after formation of various contact via structures according to an embodiment of the present disclosure.
Figure 8C:
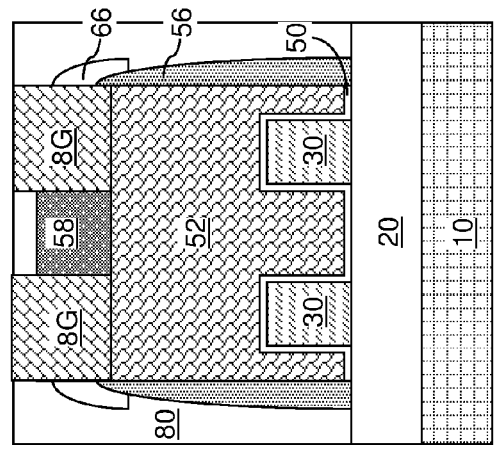
FIG. 8C is a vertical cross-sectional view of the first exemplary semiconductor structure along the vertical plane C-C' of FIG. 8A.
Figure 8B:
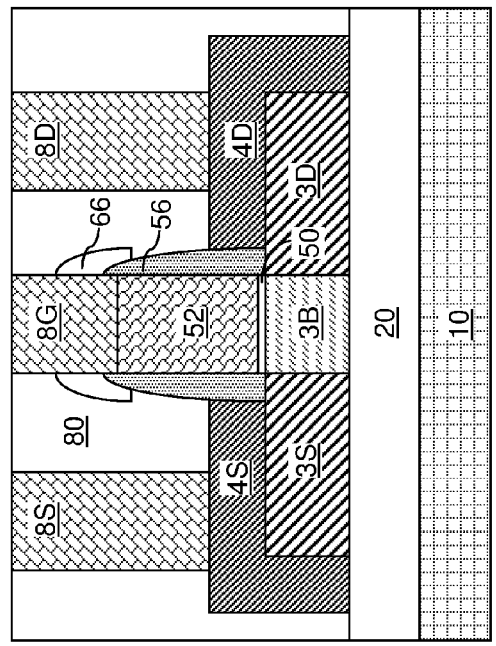
FIG. 8B is a vertical cross-sectional view of the first exemplary semiconductor structure along the vertical plane B-B' of FIG. 8A.

Referring to FIGS. 8A-8C, a contact level dielectric layer 80 can be formed on the raised source and drain regions (4S, 4D) or on the source and drain regions (3S, 3D) if raised source and drain regions are not formed. Optionally, the top surface of the contact level dielectric layer 80 can be planarized, for example, by chemical mechanical planarization. In one embodiment, the top surface of the contact level dielectric layer 80 can be planarized employing the top surface of the gate cap dielectric 58 as a stopping layer. In another embodiment, the top surface of the contact level dielectric layer 80 can be formed above the horizontal plane including the top surface of the gate cap dielectric 58. The contact level dielectric layer 80 includes a dielectric material such as silicon oxide, silicon nitride, organosilicate glass, or combinations thereof.

Various contact via structures (8S, 8D, 8G) can be formed through the contact level dielectric layer 80. The contact via structures (8S, 8D, 8G) can include, for example, a source-side contact via structure 8S contacting a raised source region 4S or at least one source region 3S, a drain-side contact via structure 8D contacting a raised drain region 4D or at least one drain region 3D, or a gate-side contact via structure 4G contacting the gate electrode 52.

The exemplary semiconductor structure includes at least a semiconductor material portion, which can be a semiconductor fin (3S, 3D, 3B), located on a substrate, and a gate structure (50, 52, 58) including a gate dielectric 50 and a gate electrode 52 and straddling the semiconductor material portion. The exemplary semiconductor structure further includes a lower dielectric spacer 56 laterally contacting, and surrounding, a lower portion of the gate structure (50, 52, 58), and an upper dielectric spacer laterally contacting, and surrounding an upper portion of the gate structure (50, 52, 58).

The upper dielectric spacer 66 includes a planar bottom surface that adjoins outer sidewalls of the lower gate spacer 56. In one embodiment, the planar bottom surface of the upper gate spacer 66 can be within a horizontal plane vertically spaced from, and located above, the horizontal interface between the lower dielectric spacer 56 and the semiconductor material portion, i.e., a semiconductor fin (3S, 3D, 3B). Further, the lower dielectric spacer 56 can be in contact with the parallel pair of sidewalls of each semiconductor fin (3S, 3D, 3B). In one embodiment, the bottommost surface of the upper dielectric spacer 66 can be located above the topmost surface of the semiconductor fins (3S, 3D, 3B). Optionally, the dielectric gate cap 58 may be removed, for example, by a wet etch, prior to formation of the contact level dielectric layer 80. If the dielectric gate cap 58 overlying the gate electrode 52 is present after formation of the contact level dielectric layer 80, the upper dielectric spacer 66 can be in contact with, and can laterally surround, the dielectric gate cap 58.

Figure 9A:
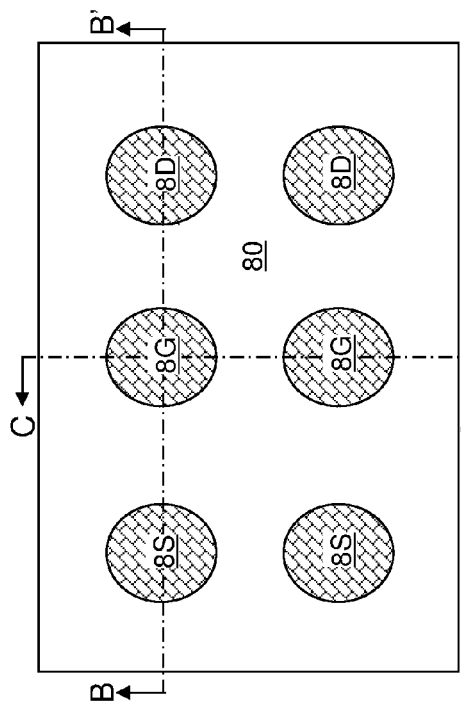
FIG. 9A is a top-down view of a variation of the first exemplary semiconductor structure according to an embodiment of the present disclosure.
Figure 9C:
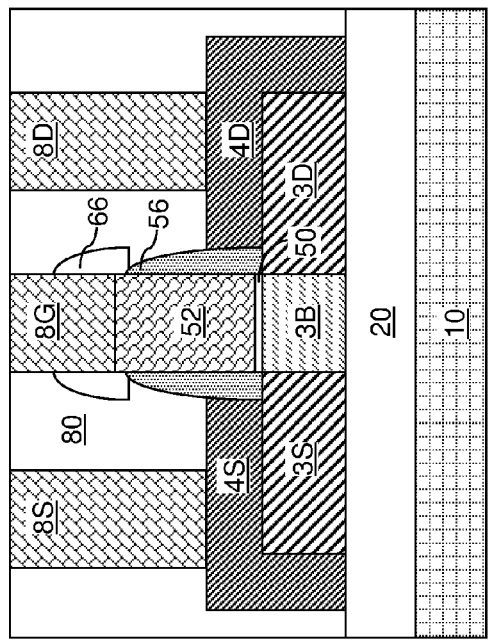
FIG. 9C is a vertical cross-sectional view of the variation of the first exemplary semiconductor structure along the vertical plane C-C' of FIG. 9A.
Figure 9B:
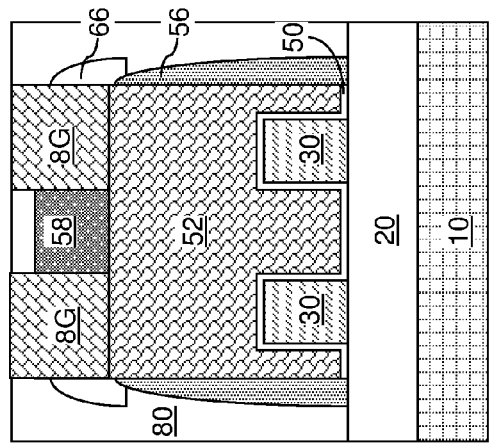
FIG. 9B is a vertical cross-sectional view of the variation of the first exemplary semiconductor structure along the vertical plane B-B' of FIG. 9A.

Referring to FIGS. 9A-9C, a variation of the first exemplary semiconductor structure is shown, in which the bottommost surface of the upper gate spacer 66 is located below the horizontal plane including the topmost surface of the gate electrode 52. In this case, the upper gate spacer 66 can contact an upper portion of each sidewall of the gate electrode 52. The configuration in which the topmost portion of the lower gate spacer 56 is formed below the top surface of the gate electrode 52 can be formed by an excessive overetch of the lower gate spacer 56. Formation of the upper gate spacer 66 on the physically exposed sidewalls of the gate structure (50, 52, 58) prevents physical exposure of the sidewall surfaces of the gate electrode 52 during the selective deposition of the raised source and drain regions (4S, 4D). Thus, undesirable deposition of a semiconductor material on the sidewalls of the gate electrode 52 can be avoided in case the gate electrode 52 includes a semiconductor material.

Figure 10A:
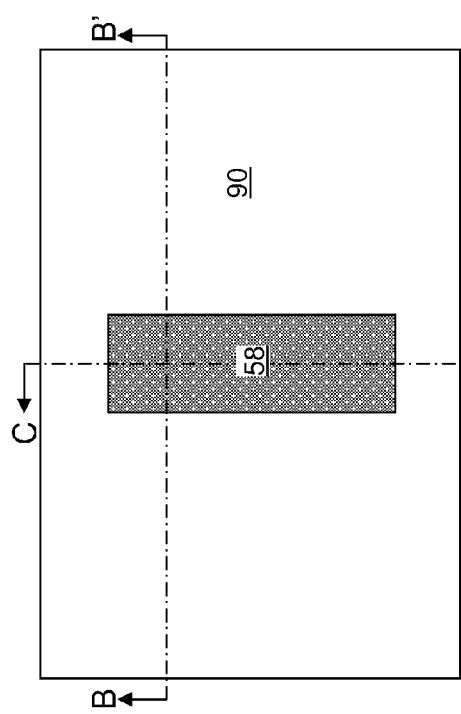
FIG. 10A is a top-down view of a second exemplary semiconductor structure after formation of a planarization dielectric layer according to an embodiment of the present disclosure.
Figure 10C:
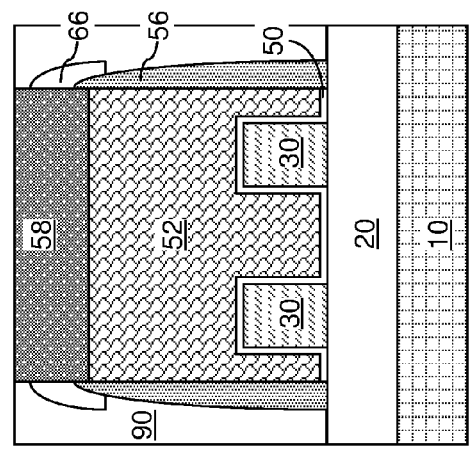
FIG. 10C is a vertical cross-sectional view of the second exemplary semiconductor structure along the vertical plane C-C' of FIG. 10A.
Figure 10B:
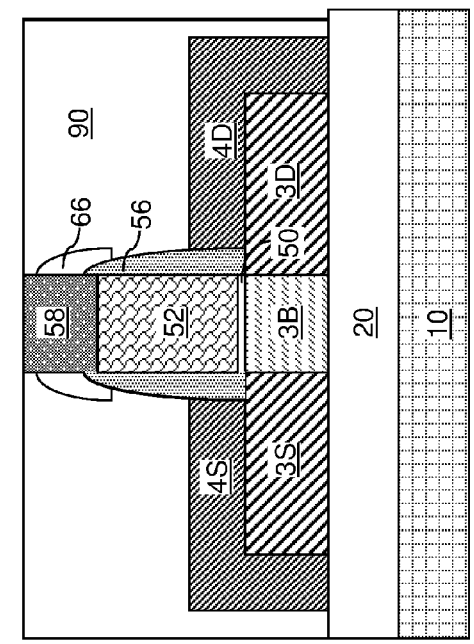
FIG. 10B is a vertical cross-sectional view of the second exemplary semiconductor structure along the vertical plane B-B' of FIG. 10A.

Referring to FIGS. 10A-10C, a second exemplary semiconductor structure can be derived from the first exemplary semiconductor structure (or variations thereof) as shown in FIGS. 7A-7C. A planarization dielectric layer 90 can be formed by deposition and planarization of a dielectric material. The planarization dielectric layer 90 includes a dielectric material such as silicon oxide, silicon nitride, organosilicate glass, or combinations thereof.

Figure 11A:
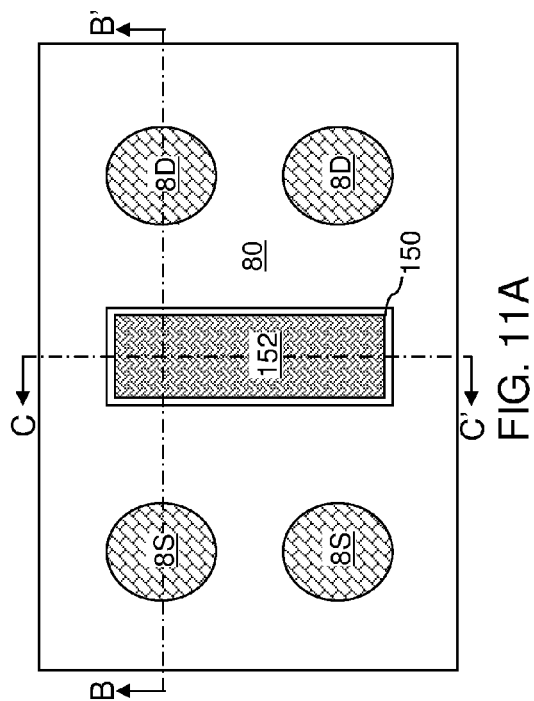
FIG. 11A is a top-down view of the second exemplary semiconductor structure after formation of a replacement gate structure and various contact via structures according to an embodiment of the present disclosure.
Figure 11C:
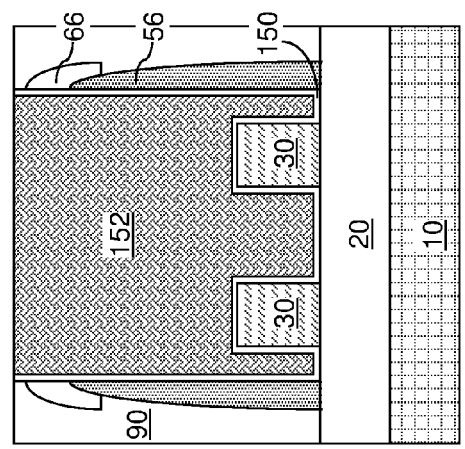
FIG. 11C is a vertical cross-sectional view of the second exemplary semiconductor structure along the vertical plane C-C' of FIG. 11A.
Figure 11B:
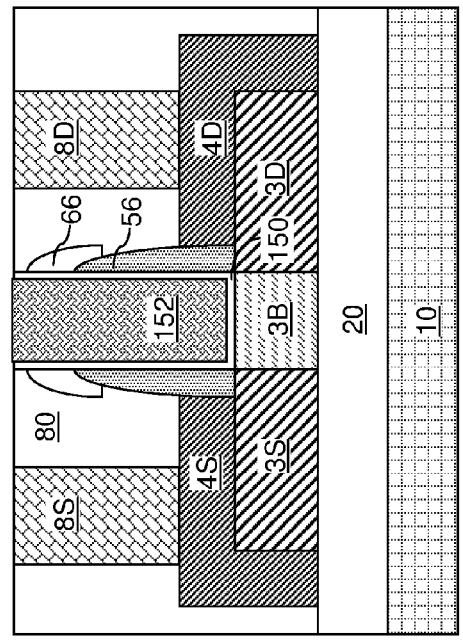
FIG. 11B is a vertical cross-sectional view of the second exemplary semiconductor structure along the vertical plane B-B' of FIG. 11A.

Referring to FIGS. 11A-11C, the gate structure (50, 52, 58) can be replaced with a replacement gate structure (150, 152). Specifically, the gate structure (50, 52, 58) can be removed selective to the planarization dielectric layer 90, the upper and lower gate spacers (56, 66), and the semiconductor fins (3S, 3D, 3B) by a combination of etch processes. A gate cavity is formed in the volume from which the gate structure (50, 52, 58) is removed. Subsequently, a gate dielectric layer and at least one conductive material layer can be deposited to fill the gate cavity. Excess portions of the gate dielectric layer and the at least one conductive material layer are removed from above the top surface of the planarization dielectric layer 90, for example, by chemical mechanical planarization. Remaining portions of the gate dielectric layer and the at least one conductive material layer form the replacement gate structure (150, 152). The replacement gate structure (150, 152) can include a U-shaped dielectric material layer 150 that includes a horizontal portion and vertical portions, and the gate electrode 152 that includes at least one conductive material.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure comprising:
    forming a gate structure including a gate dielectric and a gate electrode across a semiconductor material portion, said semiconductor material portion having an entirely planar topmost surface and is located on a substrate;
    forming a lower dielectric spacer around a lower portion of said gate structure, wherein a bottommost surface of said lower dielectric spacer is located on a first portion of said entirely planar topmost surface of said semiconductor material portion;
    forming a disposable material layer around said lower dielectric spacer, wherein said disposable material layer directly contacts an outermost sidewall of said lower dielectric spacer, a second portion of said entirely planar topmost surface of said semiconductor material portion, a sidewall surface of said semiconductor material portion, and a topmost surface of said substrate wherein said first portion and second portion of said entirely planar topmost surface are in a same geometric plane;
    forming an upper dielectric spacer around an upper portion of said gate structure and on a top surface of said disposable material layer; and
    removing said disposable material layer selective to said upper and lower dielectric spacers and said semiconductor material portion.

2. The method of claim 1, wherein said disposable material layer includes a planar top surface.

3. The method of claim 2, wherein said planar top surface of said disposable material layer is formed below a horizontal plane including a topmost surface of said lower dielectric spacer.

4. The method of claim 3, wherein said planar top surface of said disposable material layer is formed above another horizontal plane including a topmost surface of said semiconductor material portion.

5. The method of claim 1, wherein said gate electrode includes another semiconductor material portion.

6. The method of claim 1, further comprising forming a source region and a drain region within said semiconductor material portion prior to formation of said upper dielectric spacer.

7. The method of claim 1, further comprising selectively depositing a semiconductor material on physically exposed surfaces of said semiconductor material portion after said disposable material layer is removed.

8. The method of claim 1, wherein said disposable material layer includes an organic polymer material or an inorganic carbon-containing material.

9. The method of claim 8, wherein said removing the disposable material layer comprises ashing.

10. The method of claim 1, wherein said disposable material layer includes a semiconductor material having a different composition than said semiconductor material portion.

11. The method of claim 10, wherein said semiconductor material of said disposable material layer comprises a germanium-containing compound having a germanium content of greater than 80%.

12. The method of claim 11, wherein said removing said disposable material layer comprises a combination of hydrogen peroxide and hydrofluoric acid.

13. The method of claim 1, wherein said disposable material layer includes a material selected from amorphous carbon and organosilicate glass.

14. The method of claim 1, further comprising forming a contact level dielectric layer, wherein said contact level dielectric layer has a topmost surface that is located above a topmost surface of said gate structure and a bottommost surface that is coplanar with a bottommost surface of said semiconductor material portion.

15. The method of claim 14, wherein a portion of said contact level dielectric layer is in direct contact with an entire outermost surface and an uppermost surface of said upper dielectric spacer, and another portion of said contact level dielectric layer is in direct contact with a planar bottom surface of said upper dielectric spacer.

16. The method of claim 1, wherein said semiconductor material portion is a semiconductor fin, and said semiconductor fin is formed by patterning a semiconductor material of a semiconductor substrate.

17. The method of claim 16, further comprising forming a source region in a first portion of the semiconductor fin and on one side of the gate structure and forming a drain region in a second portion of the semiconductor fin and on another side of the gate structure.

18. The method of claim 6, further comprising forming a raised source region on a physically exposed surface of said source region and a raised drain region on a physically exposed surface of the drain region, wherein said forming said raised source and drain regions comprise selective deposition of a semiconductor material.

19. The method of claim 18, wherein each of said raised source region and said raised drain region contacts the lower dielectric spacer, but not the upper dielectric spacer.

20. The method of claim 14, further comprising forming contact structures in said contact level dielectric material, said contact structures comprise a source-side contact via structure, a drain-side contact via structure, and a gate-side contact via structure.

* * * * *